US011422210B2

(12) United States Patent
Narasimhan et al.

(10) Patent No.: US 11,422,210 B2
(45) Date of Patent: Aug. 23, 2022

(54) APPARATUSES, SYSTEMS, AND METHODS FOR WEIGHT DETECTION

(71) Applicant: HONEYWELL INTERNATIONAL INC., Charlotte, NC (US)

(72) Inventors: Kumaran Narasimhan, Bangalore (IN); Frederick W. Hintz, Freeport, IL (US); William McGraw, Flower Mound, TX (US); Thomas John Olson, Freeport, IL (US); J. L. Hunter, Lanark, IL (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 79 days.

(21) Appl. No.: 17/038,469

(22) Filed: Sep. 30, 2020

(65) Prior Publication Data
US 2021/0109170 A1 Apr. 15, 2021

(30) Foreign Application Priority Data
Oct. 10, 2019 (IN) .............................. 201911040960

(51) Int. Cl.
*G01R 33/00* (2006.01)
*G01R 33/02* (2006.01)
*G01R 33/09* (2006.01)
*G01D 5/14* (2006.01)

(52) U.S. Cl.
CPC ........... *G01R 33/093* (2013.01); *G01D 5/145* (2013.01); *G01R 33/098* (2013.01)

(58) Field of Classification Search
CPC ..... G01R 33/093; G01R 33/098; G01D 5/145
See application file for complete search history.

(56) References Cited

U.S. PATENT DOCUMENTS

| 4,738,325 A | 4/1988 | Bullivant et al. |
| 2004/0263154 A1 | 12/2004 | Young et al. |
| 2007/0001354 A1* | 1/2007 | Stothers ................. B64C 1/066 267/136 |
| 2011/0062952 A1 | 3/2011 | Smargiassi et al. |

FOREIGN PATENT DOCUMENTS

| EP | 2251476 B1 | 5/2013 |
| JP | 2005-257451 A | 9/2005 |

\* cited by examiner

*Primary Examiner* — Alesa Allgood
(74) *Attorney, Agent, or Firm* — Alston & Bird LLP

(57) ABSTRACT

Apparatuses, systems, and associated methods of manufacturing are described that provide for improved sensor devices. An example sensor device includes a magnet mounting tube and a magnet supported within the magnet mounting tube. The sensor device includes a sensor mounting tube that receives at least a portion of the magnet mounting tube and supported magnet therein. The sensor device includes a magnetic sensor affixed to the sensor mounting tube. The sensor device includes a spring positioned around the magnet mounting tube and the sensor mounting tube such that the magnet and the magnetic sensor are surrounded by the spring. In an instance in which a load is applied to either a first end or second end of the spring, the magnet mounting tube translates relative the sensor mounting tube so as to induce a change in magnetic flux identified by the magnetic sensor indicative of a weight of the load.

20 Claims, 12 Drawing Sheets

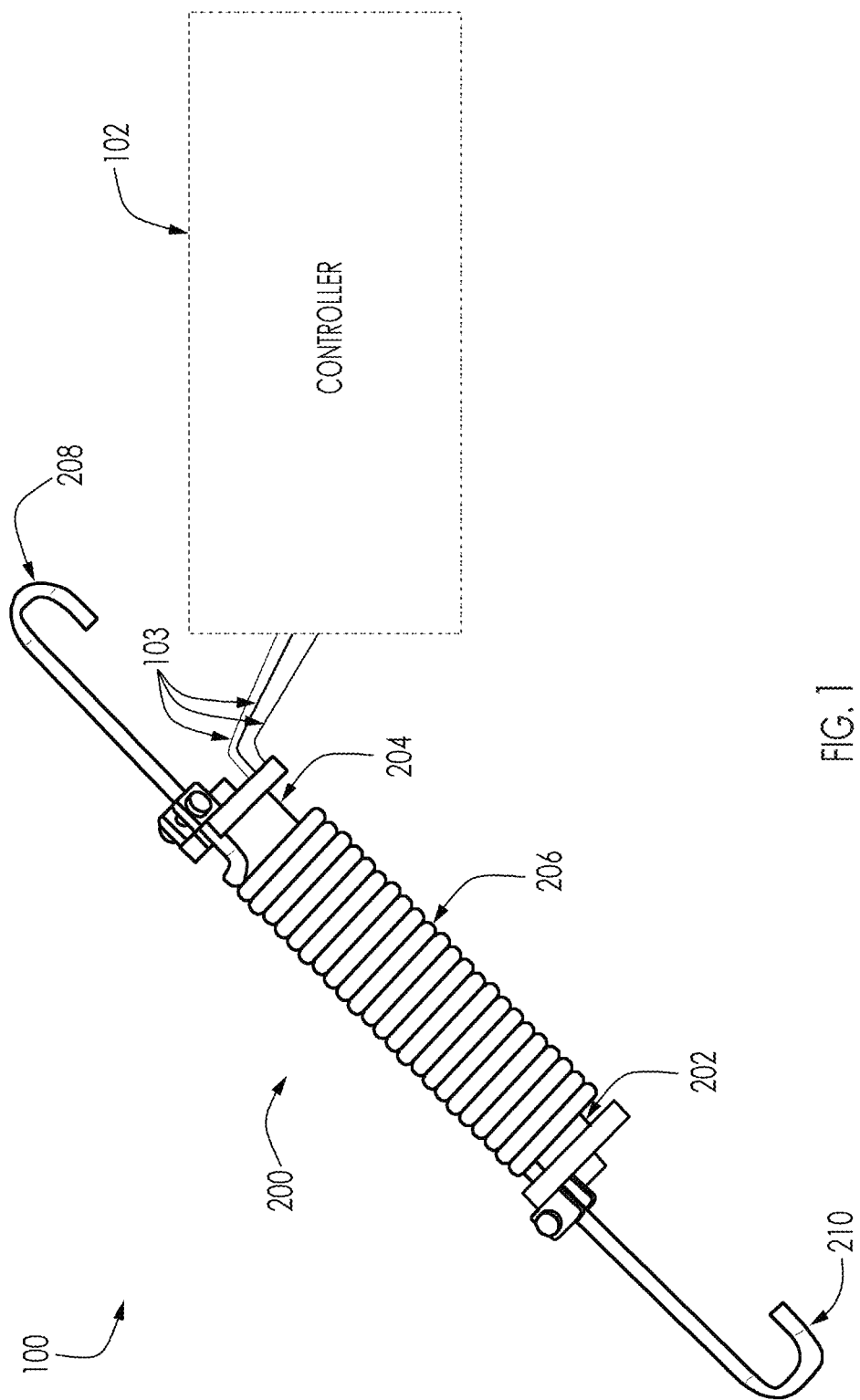

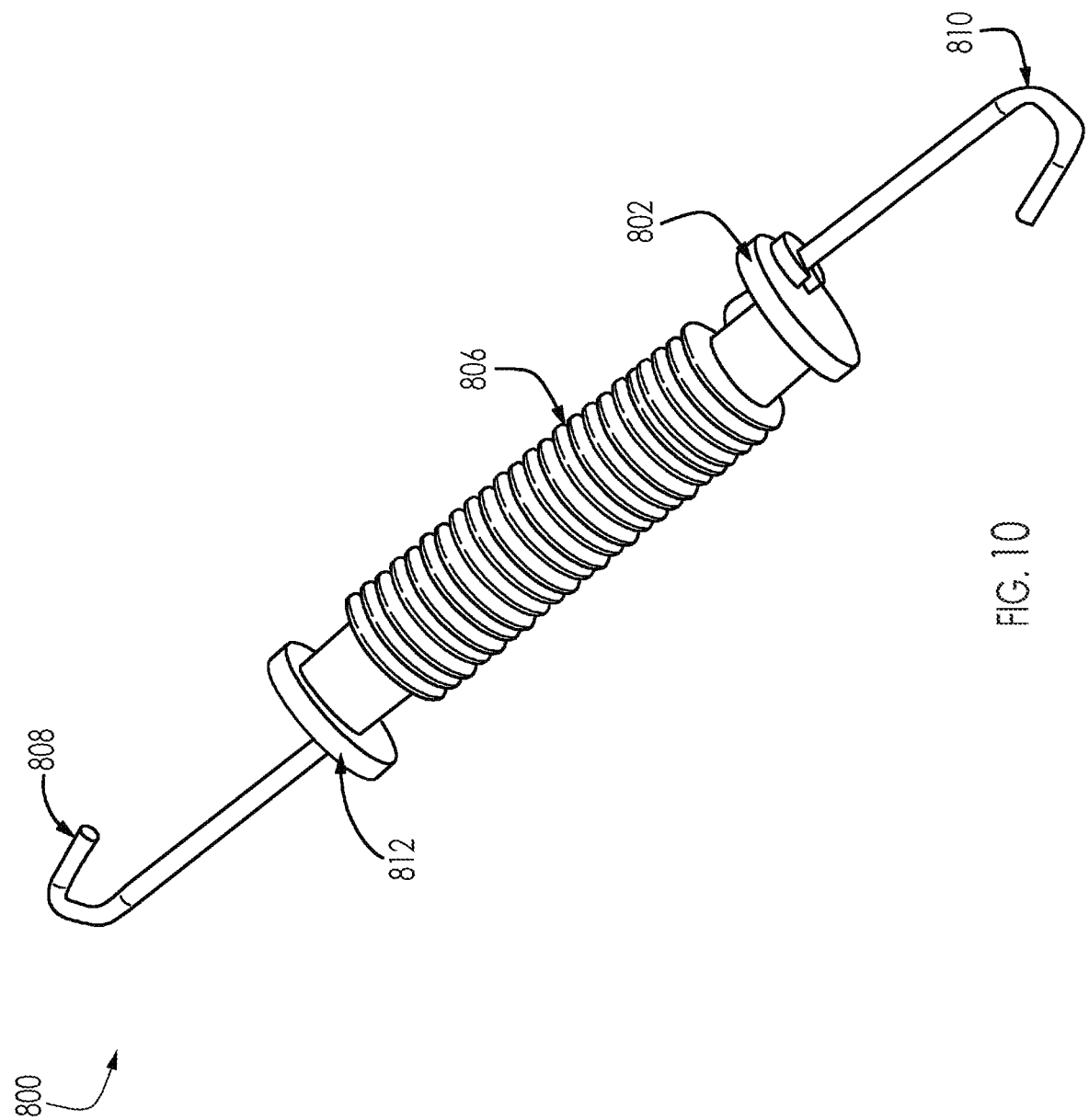

APPARATUSES, SYSTEMS, AND METHODS FOR WEIGHT DETECTION

TECHNOLOGICAL FIELD

Example embodiments of the present invention relate generally to sensing systems and, more particularly, to improved sensor configurations for weight detection.

BACKGROUND

In various commercial appliances and related applications, accurate weight determination is needed to ensure proper operation. For example, washing machines, automotive shock absorbers, check valves, spring balances, and the like may rely upon weight detection sensors in order to properly identify a weight (e.g., load, force, etc.) and, based on this determination, perform one or more operations. The inventors have identified numerous deficiencies with existing technologies in the field, the remedies for which are the subject of the embodiments described herein.

BRIEF SUMMARY

Systems, apparatuses, and methods are disclosed herein for providing improved sensor device operation. An example sensor device may include a magnet mounting tube and a magnet supported within the magnet mounting tube. The sensor device may further include a sensor mounting tube configured to receive at least a portion of the magnet mounting tube and supported magnet therein and a magnetic sensor affixed to the sensor mounting tube. The sensor device may also include a spring positioned around the magnet mounting tube and the sensor mounting tube such that the magnet and the magnetic sensor are surrounded by the spring. The spring may define a first end and a second end. In an instance in which a load is applied to either the first end or the second end, the magnet mounting tube may be configured to translate relative the sensor mounting tube so as to induce a change in magnetic flux identified by the magnetic sensor indicative of a weight of the load.

In some embodiments, the sensor mounting tube may define a hollow interior configured to receive the portion of the magnet mounting tube therein. In such an embodiment, the sensor mounting tube and the magnet mounting tube may be positioned such that, in operation, an air gap is defined between the magnet and the magnetic sensor.

In some cases, the magnet may be cylindrical. In other cases, the magnet may be defined as a rectangular prism.

In some embodiments, the sensor device may further include a sensor holder cap configured to secure the sensor mounting tube to the first end of the spring.

In some embodiments, the sensor device may also include a magnet holder cap configured to secure the magnet mounting tube to the second end of the spring.

In any embodiment, the magnetic sensor may include a hall effect sensor, an anisotropic magneto-resistive (AMR) sensor, a giant magnetoresistance (GMR) sensor, or a tunnel-magnetoresistance (TMR) sensor.

An example sensing system may include a magnet mounting tube and a magnet supported within the magnet mounting tube. The sensor device may further include a sensor mounting tube configured to receive at least a portion of the magnet mounting tube and supported magnet therein and a magnetic sensor affixed to the sensor mounting tube. The sensor device may also include a spring positioned around the magnet mounting tube and the sensor mounting tube such that the magnet and the magnetic sensor are surrounded by the spring. The spring may define a first end and a second end. The sensing system may further include a controller communicably coupled to the magnetic sensor. In an instance in which a load is applied to either the first end or the second end: the magnet mounting tube may be configured to translate relative the sensor mounting tube; the magnetic sensor may be configured to identify a change in magnetic flux; and the controller may be configured to determine a weight of the load based upon the change in magnetic flux.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

FIG. 1 is a perspective view of a sensing system according to an example embodiment;

FIG. 10 is a perspective view of the sensor device of FIG. 8;

DETAILED DESCRIPTION

Overview

Figure 2B:
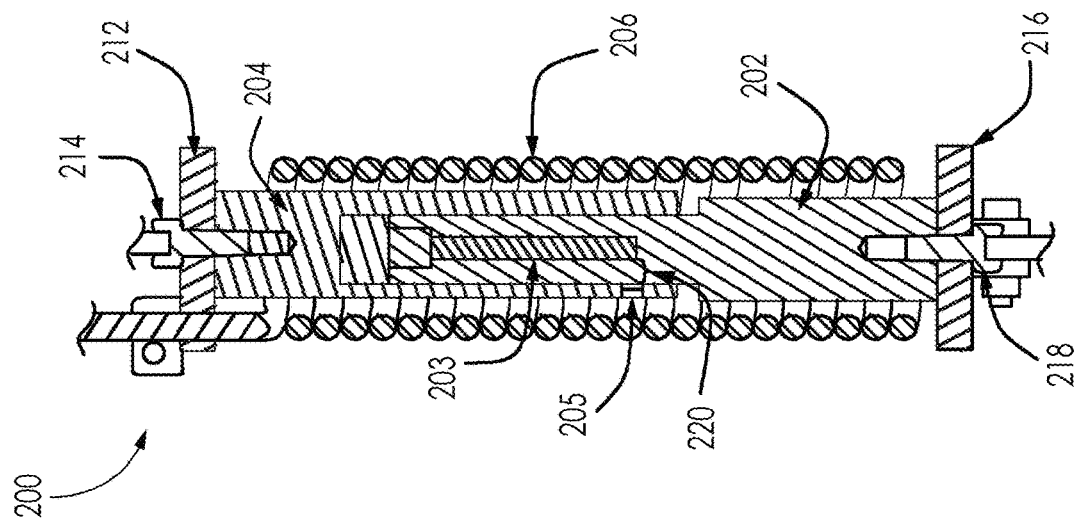
FIGS. 2A-2B are cross-sectional views of the sensor device of FIG. 1 according to an example embodiment.

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As described above, various appliances and related applications rely upon accurate weight detection/determination in order to successfully perform their respective operations. By way of example, a commercial washing machine may include a tub or equivalent washing chamber (e.g., any enclosure) that receives one or more items (e.g., towels, shirts, pants, etc.) therein. During operation, the tub may receive an input of wash water (e.g., supplied by a water source) as well as a cleaning solution (e.g., laundry detergent or the like) in order to clean the items within the tub. As would be evident to one of ordinary skill in the art in light of the present disclosure, in instances in which the tub is full of items, more water and cleaning solution may be necessary as compared to instances in which only a few items are within the tub. In traditional washing machines, a user may select the size of the items in the tub as well as manually supply the amount of washing solution to the tub.

In emerging appliances, however, the washing machine may automatically determine the size or number of items within the tub (e.g., via the sensor devices described hereafter) and may supply cleaning solution (e.g., from a cleaning solution reservoir or the like) and/or water based upon the determined size or number of items. As such, accurate determination of the size or number of items (e.g., the weight of the items) within in the tub is vital for accurately determining the amount of water and cleaning solution to be supplied to the washing tub. Failure to accurate perform this determination may result in insufficient water and/or cleaning solution to properly clean the items within the washing chamber or may result in excess water and cleaning solution supplied to the washing tub. As such, embodiments of the present application provide for sensor devices and associated sensing systems for improved weight detection. In doing so, the embodiments of the present application may reduce or minimize error in weight detection and, as a result, reduce or eliminate waste associated with appliances.

Although described herein with reference to an example washing machine, the present disclosure contemplates that the sensor devices and associated sensor systems may also be applicable to other applications in which accurate weight determination is needed (e.g., automotive shock absorbers, check valves, spring balances, and the like). Furthermore, although described herein as weight, the present disclosure contemplates that the referenced weight may refer to any load, force, or the like detected by the sensor devices described hereafter.

With reference to FIG. 1, an example sensing system 100 is illustrated. As shown, the sensing system 100 may include a sensor device 200 and a controller 102 communicably coupled to the sensor device 102 (e.g., in electrical communication with the magnetic sensor 205 of FIGS. 2A-2B). In some embodiments, the sensing system 100 may include one or more wires 103 configured to provide electrical communication between the sensor device 200 and the controller 102. While illustrated and described herein with reference to a physical connection via wires 103, the controller 102 may be connected to the sensor device 200 via any wired or wireless connection.

As described more fully hereafter with reference to the operation of the sensor 200, in some embodiments, the controller 102 may be provided as part of the sensing system 100 for performing some or all of the weight detection determinations. As such, the controller 102 may include circuitry, networked processors, or the like configured to perform some or all of the processes described herein and may be any suitable network server and/or other type of processing device. For example, the controller 102 may be configured to receive sensor data (e.g., magnetic flux data, electrical signals, or the like) and may include any of a variety of fixed terminals, such as a server, desktop, or kiosk, or it may comprise any of a variety of mobile terminals, such as a portable digital assistant (PDA), mobile telephone, smartphone, laptop computer, tablet computer, or in some embodiments, a peripheral device that connects to one or more fixed or mobile terminals. In some embodiments, the controller 102 may be located remotely from the sensor device 200, although in other embodiments, the sensor device 200 may comprise the controller 102. Despite the many arrangements contemplated herein, the controller 102 is shown and described herein as a single computing device to avoid unnecessarily overcomplicating the disclosure.

Figure 2A:
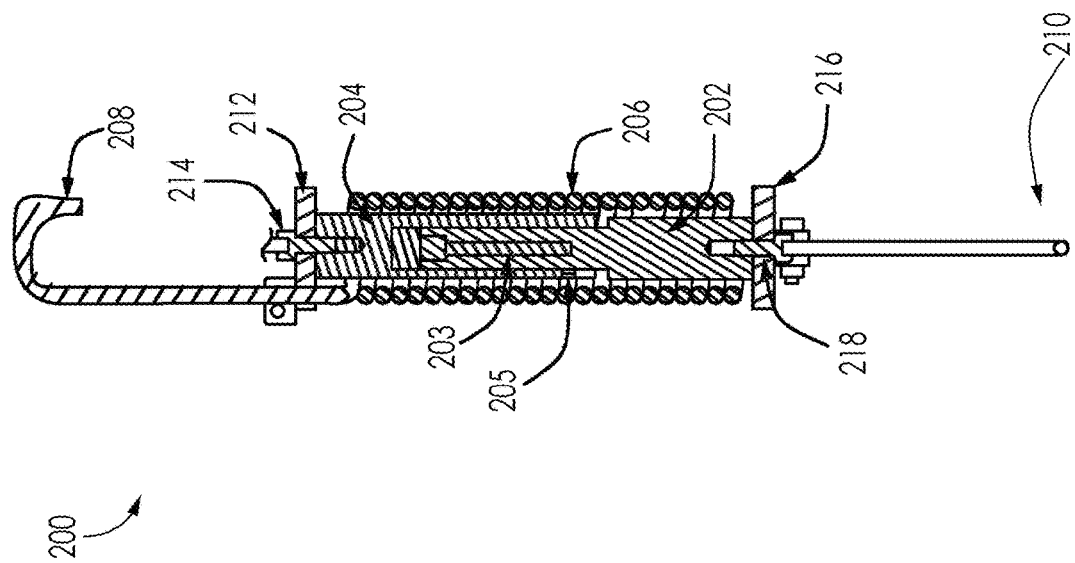
Figure 3:
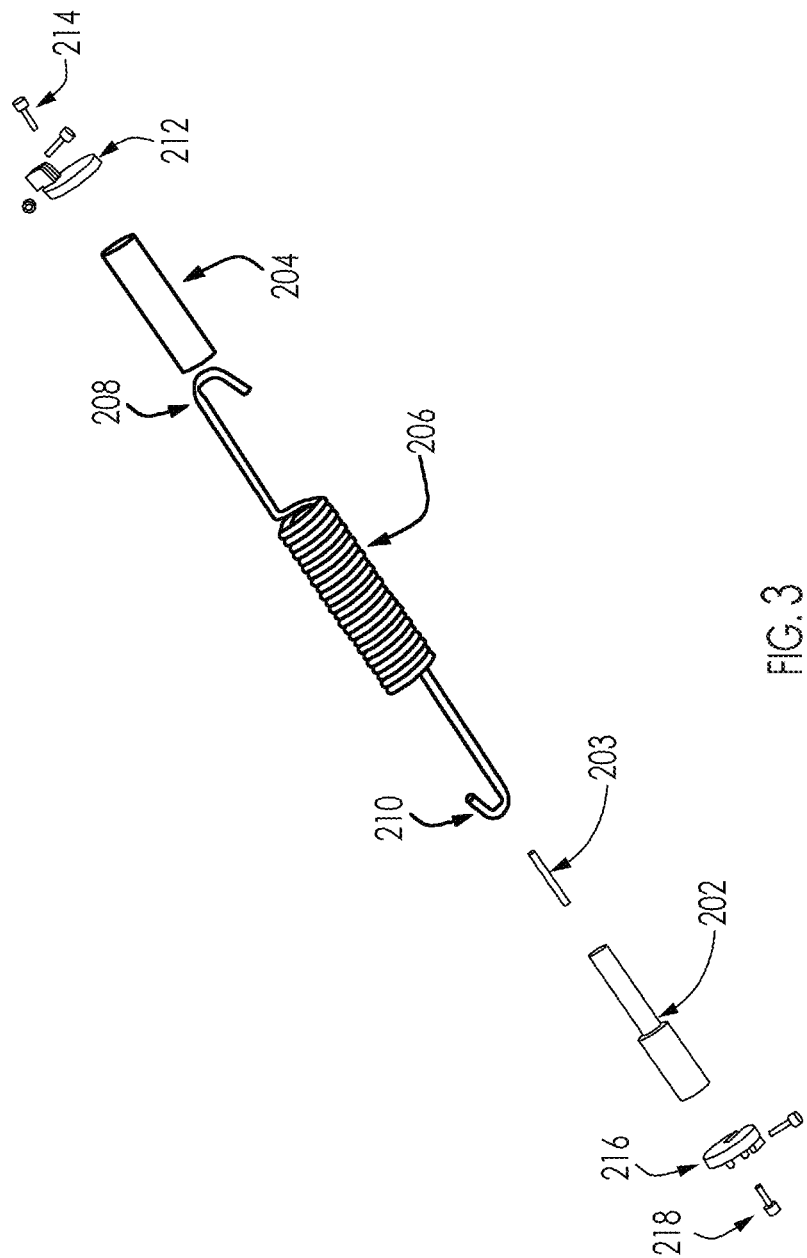
FIG. 3 is an exploded view of the sensor device of FIGS. 1-2B according to an example embodiment.

With reference to FIGS. 1-3, the sensor device 200 may include a magnet mounting tube 202, a sensor mounting tube 204, and a spring 206. As shown, the magnet mounting tube 202 may define a cylindrical housing (e.g., having a circular cross-section) that is configured to receive and support a magnet 203 therein. The magnet 203 may similarly be cylindrical in shape and may be formed of any suitable material (e.g., iron, cobalt, nickel, rare earth magnets, ceramic magnets, bonded magnets, or the like). While described herein with reference to a cylindrical magnet, the present disclosure contemplates that the magnet 203 may also be formed as a rectangular prism. The sensor device 200 may further include a sensor mounting tube 204 and a magnetic sensor 205 affixed to the sensor mounting tube 204. The sensor mounting tube 204 may be configured to receive at least a portion of the magnet mounting tube 202 and supported magnet 205 within the sensor mounting tube 204. In some embodiments and as illustrated in the cross-sectional views of FIGS. 2A-2B, the sensor mounting tube 204 may be cylindrical in shape and further define a hollow interior configured to receive a portion of the magnet mounting tube 202 therein. In particular, the sensor mounting tube 204 may be configured to receive the portion (e.g., an end) of the magnet mounting tube 202 supporting the magnet 203 such that the magnet 203 extends at least partially into the sensor mounting tube 204. Furthermore, the engagement between the magnet mounting tube 202 and the sensor mounting tube 204 is such that the magnet mounting tube 202 may translate relative the sensor mounting tube 204 (e.g., may move within the sensor mounting tube 204).

The magnetic sensor 205 may include a hall effect sensor, an anisotropic magneto-resistive (AMR) sensor, a giant magnetoresistance (GMR) sensor, a tunnel-magnetoresistance (TMR) sensor, or any similar sensor configured to identify a change in magnetic flux, a difference in magnetic field, a change (e.g., increase or decrease) of a magnitude of a magnetic field, or the like. In particular, movement of the magnet's 203 position (e.g., and associated movement of the magnet mounting tube 202) within the sensor mounting tube 204 may generate a change in magnetic flux that is identified via the differential voltage readings in the magnetic sensor 205. In order to prevent unintended contact between the magnetic sensor 205 and the magnet 203, the magnet mounting tube 202 and the sensor mounting tube 204 may be dimensioned (e.g., sized and shaped) such that an air gap 220 is defined between the magnet 203 and the magnetic sensor 205. In some embodiments, the air gap 220 may be five (5) millimeters.

The sensor device 200 may further include a spring 206 positioned around the magnet mounting tube 202 and the sensor mounting tube 204. As shown in FIGS. 2A-2B, the spring 206 may be similarly located around the magnet 203 and the magnetic sensor 205 such that the magnet 203 is aligned with the direction of linear displacement of the spring 206 (e.g., the cylindrical magnet 203 is substantially aligned with the center of the coils of the spring 206). As shown in FIGS. 1, 2A, and 3, the spring 206 may define a first end 208 proximate the sensor mounting tube 204 and a second end 210 proximate the magnet mounting tube 202. As illustrated, each of the first end 208 and the second end 210 may be formed or otherwise define engagement elements (e.g., hooks, clips, etc.) configured to secure each end of the spring 206 when installed, for example, in an appliance. By way of continued reference to an example washing machine, the first end 208 may be configured to be attached, secured, etc. to a housing or other stable feature of the washing machine while the second end 210 may be configured to be attached, secured, etc. to the washing tub of the washing machine.

The sensor device 200 may further include a sensor holder cap 212 configured to secure the sensor mounting tube 204 with the first end 208 of the spring 206. As shown, the sensor holder cap 212 may define a lip, flange, extension or the like configured to receive at least a portion of the first end 208 of the spring 206. This flange may, in some embodiments, may include screws, latches, clips, etc. configured to lock the sensor holder cap 212 to the first end 208 of the spring 206. As shown, the sensor holder cap 212 may be secured to the sensor mounting tube 204 via a fastener 214 (e.g., screw, snap, clip, etc.). Similarly, the sensor device 200 may further include a magnet holder cap 216 configured to secure the magnet mounting tube 202 with the second end 210 of the spring 206. As shown, the magnet holder cap 216 may define a lip, flange, extension or the like configured to receive at least a portion of the second end 210 of the spring 206. This flange may, in some embodiments, may include screws, latches, clips, etc. configured to lock the magnet holder cap 216 to the second end 210 of the spring 206. As shown, the magnet holder cap 216 may be secured to the magnet mounting tube 202 via a fastener 218 (e.g., screw, snap, clip, etc.).

During operation in which the first end 208 of the spring 206 and the second end 210 of the spring 206 are secured to corresponding elements of, for example, a washing machine, at least one of the first end 208 or the second end 210 may receive a load, force, etc. applied thereto. With continued reference to the example implementation above, the second end 210 may be attached to a washing tub of a washing machine while the first end 208 is attached to a portion of the housing (e.g., or other stable element) of the washing machine. As items (e.g., clothes, towels, etc.) are placed in the washing tub, a load (e.g., force or the like) may be applied to the spring 206 at the second end 210. In particular a downward force (e.g., a force in a direction opposite the first end 208), may be applied to the spring 206 via the items within the washing tub. The load applied to, for example, the second end 210 may cause displacement of the magnet mounting tube 202 secured to the spring 206 at the second end 210 via the magnet mounting cap 216. In particular, the magnet mounting tube 202 and magnet 203 may translate (e.g. slide within) the sensor mounting tube 204.

With continued reference to FIGS. 2A-2B, movement of the magnet 203 caused by the load imparted on the second end 210 of the spring 206 may cause a change in magnetic flux identified by the magnetic sensor 205. For example, as the magnet 203 is moved closer to the magnetic sensor 205, the magnitude of the magnetic field identified by the magnetic sensor 205 may increase. This change in magnetic flux (e.g., change in magnitude of a corresponding magnetic field) may be used by the magnetic sensor 205 (e.g., or in conjunction with the controller 102 of FIG. 1) to identify a displacement of the magnet mounting tube 202 and, by association, a corresponding displacement of the spring 206. As would be evident to one of ordinary skill in the art in light of the present disclosure, Hooke's law states that the force a spring 206 exerts on an object attached to the spring 206 follows the equation $F = -kx$, where F represents force, k represents the spring constant of the spring 206, and x represents the displacement of the spring 206. The spring constant k is a known parameter representative of the stiffness of the selected spring 206 (e.g., based the coils of the spring, the spring's material, etc.). As such, the magnetic sensor 205 (e.g., or in conjunction with the controller 102 of FIG. 1) may determine the load F experienced by the spring 206 based upon the known spring constant k of the selected spring 206 and the displacement x determined based upon the magnetic flux detected by the magnetic sensor 205.

In doing so, the sensor device 200 and associated sensing system 100 of the present application operates to provide improved weight detection. In particular, placement of the magnet 203 in the axis of the spring (e.g., coincident to the axis of the spring) reduces misalignment error found in conventional sensor configurations. For example, magnets and associated sensors may be traditionally located outside any corresponding spring. This relative positioning results in increased misalignment error given that the position of the magnet is far removed from the axis of movement of the spring. Furthermore, positioning of the magnet in conventional devices outside of the spring may increase error associated with the magnetic effect of the spring. Said differently, in traditional sensor configurations the spring may be formed of a magnetic material (e.g., iron) such that the spring may interfere with the magnetic field of the magnet. By locating the magnet 203 and magnetic sensor 205 within the spring 206, any magnetic effect for the spring 206 is reduced. Still further, the air gap 220 provided between the magnet 203 and the magnetic sensor 205 of the present application further operates to improve the linearity of the magnetic sensor 205 as compared to traditional sensors.

Figure 4:
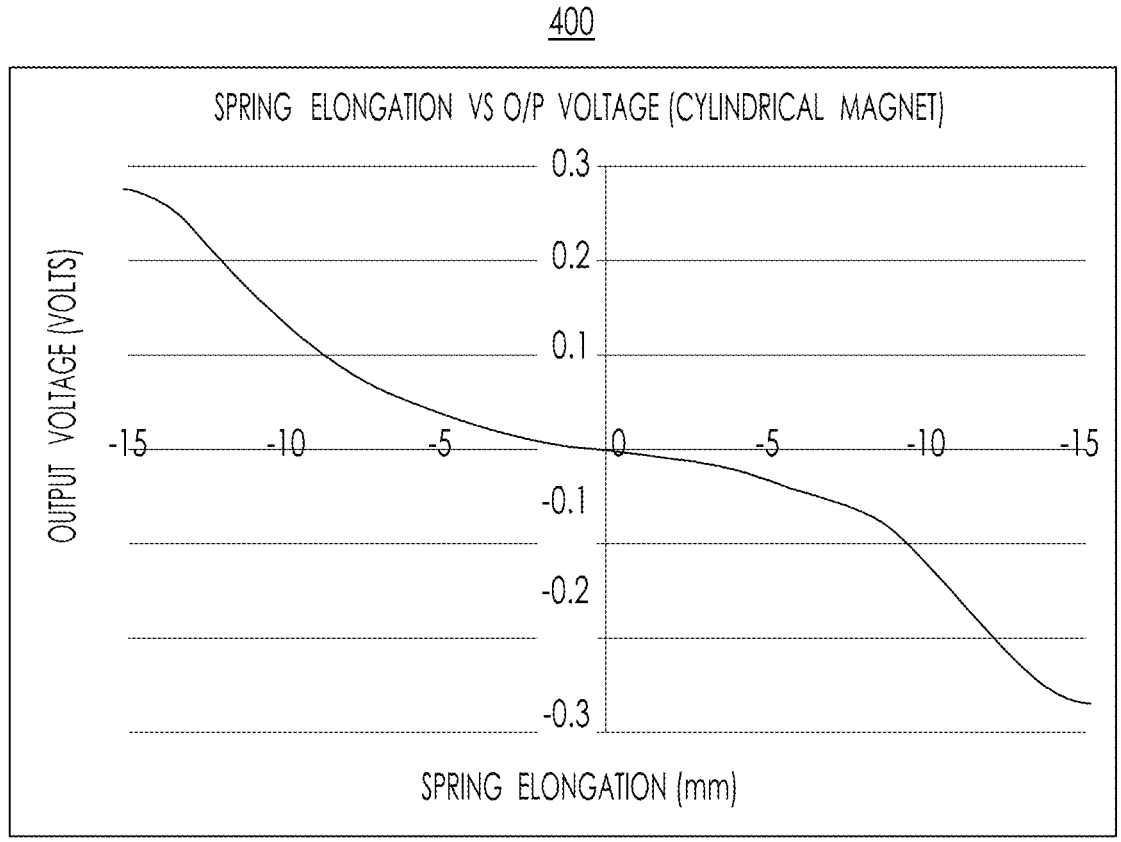
FIG. 4 is an example plot of spring elongation vs. output voltage for the sensor devices of the present disclosure.
Figure 5:
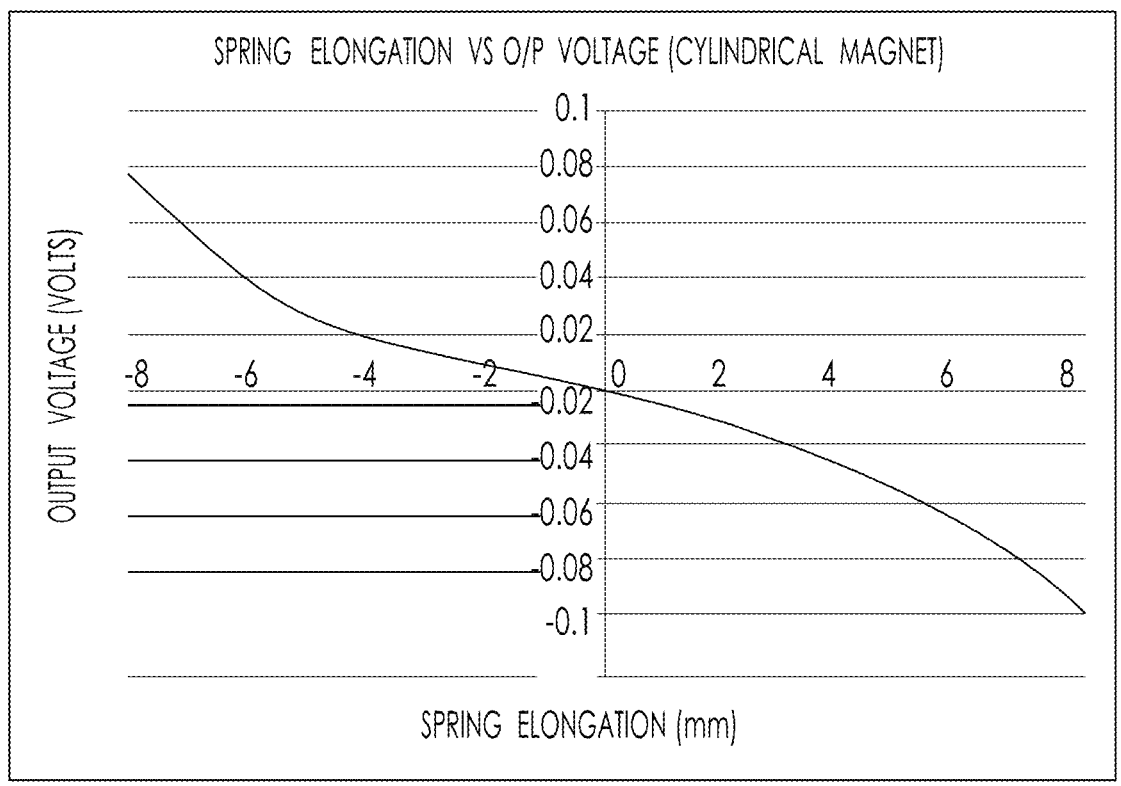
FIG. 5 is another example plot of spring elongation vs. output voltage for the sensor devices of the present disclosure.
Figure 6:
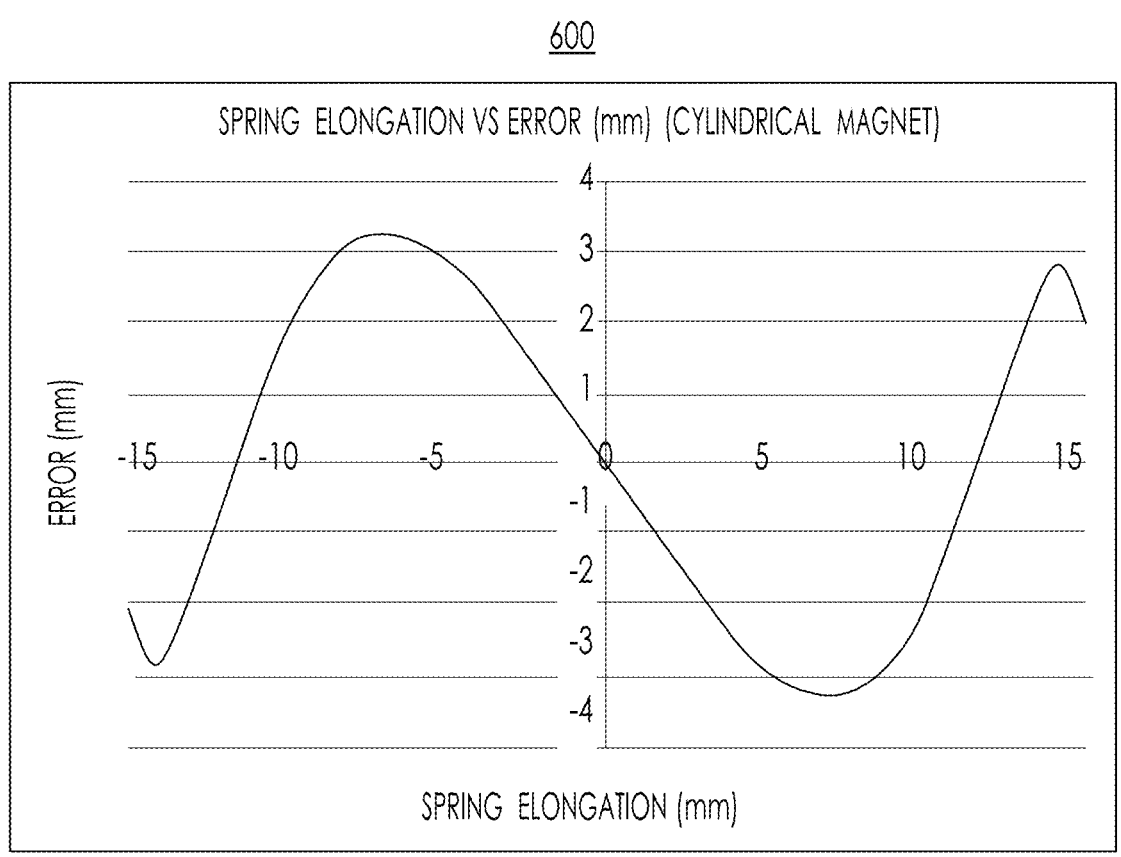
FIG. 6 is an example plot of spring elongation vs. error for the sensor devices of the present disclosure.

Turning now to FIGS. 4-6, various plots regarding the performance of the sensor device 200 and associated sensing system 100 are illustrated. With reference to FIG. 4, a plot of spring elongation vs. output voltage is illustrated for a cylindrical magnet. With reference to FIG. 5, another example plot of spring elongation vs. output voltage for the sensor device 200 is illustrated. In particular, FIG. 5 illustrates performance of the sensor device 200 over a sixteen (16) millimeter range. In some embodiments, the sensor device 200 may be configured (e.g., optimized) for operation with spring 206 displacement less than sixteen (16) millimeters. With reference to FIG. 6, an example plot of spring elongation vs. error for the sensor device 200 is illustrated.

Figure 8:
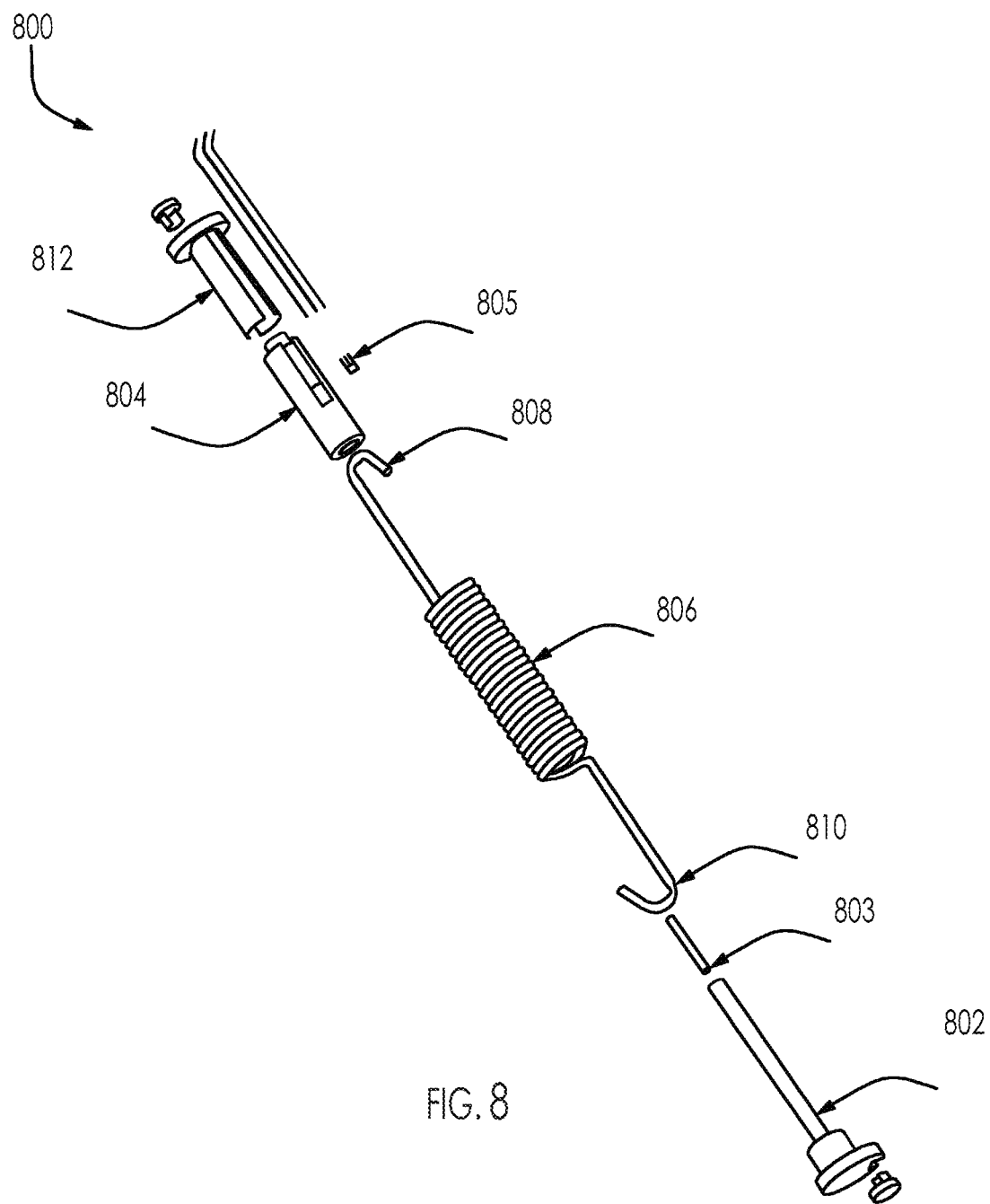
FIG. 8 is an exploded view of a sensor device according to an example embodiment.

With reference to FIGS. 8-11B, a sensor device 800 embodiment is illustrated. As shown, the sensor device 800 may include a magnet mounting tube 802 that may be configured to support a cylindrical magnet 803 therein. As shown in FIG. 8, the magnet mounting tube 802 may be further configured to secure the magnet mounting tube 802 to the second end 810 of the spring 806. Said differently, the magnet mounting tube 802 may be configured to incorporate similar functionality of the magnet holder cap 216 as described above with reference to FIGS. 1-3. The sensor device 800 may further include a sensor mounting housing 804 configured to receive a magnetic sensor 805 affixed thereto. As shown, the sensor device 800 may also include a secondary sensor tube 812 configured to engage the sensor mounting tube 804 and secure the sensor 805 and the sensor mounting tube 804 to the first end 808 of the spring 806. As shown, the sensor mounting tube 804 and the secondary sensor tube 812 may define corresponding slots so that the sensor mounting tube 804 may translate relative the secondary sensor tube 812. The magnet 803 and the magnetic sensor 805 may be spaced by an air gap 820, for example an air gap 820 of five (5) millimeters.

Figure 9:
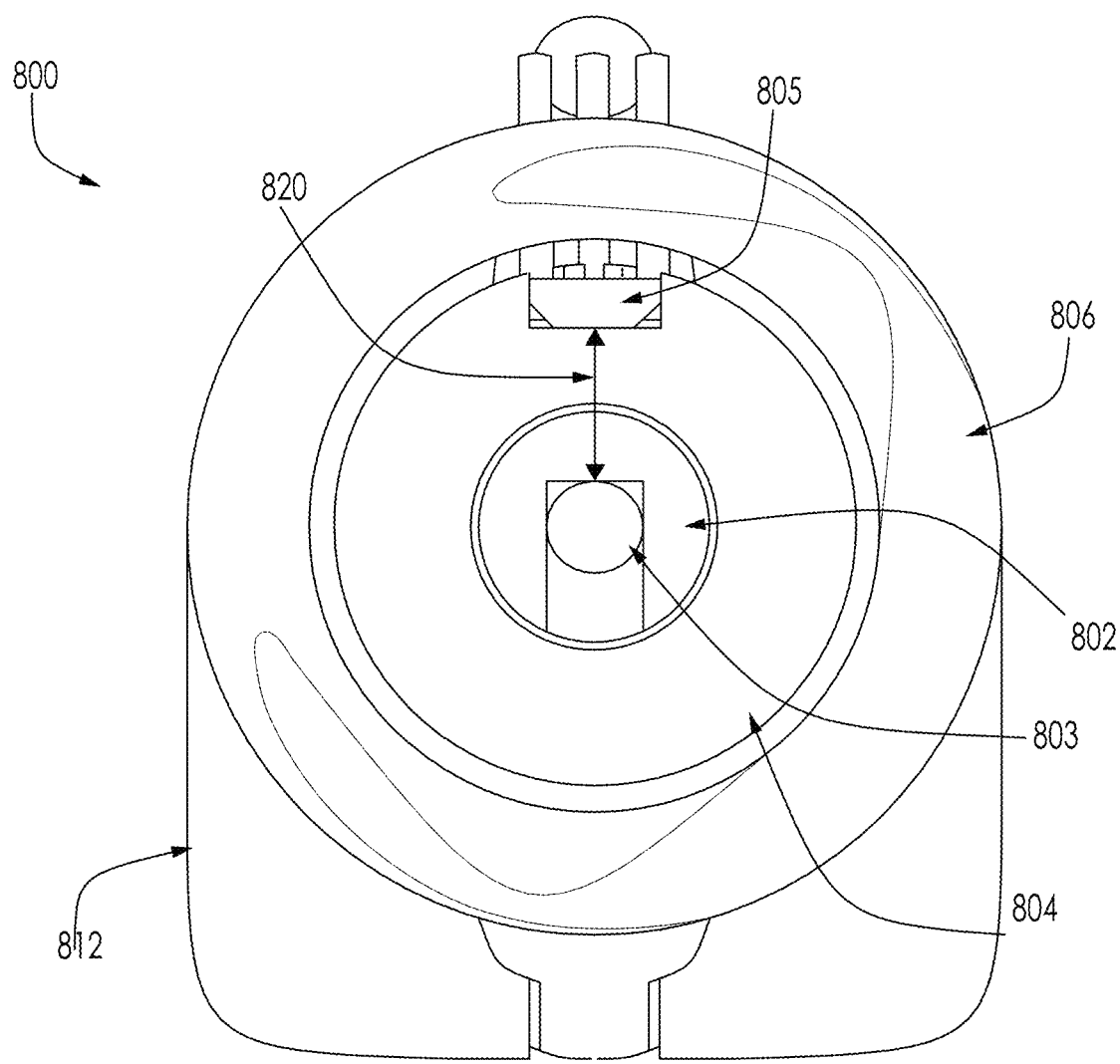
FIG. 9 is a top cross-sectional view of the sensor device of FIG. 8.
Figure 11B:
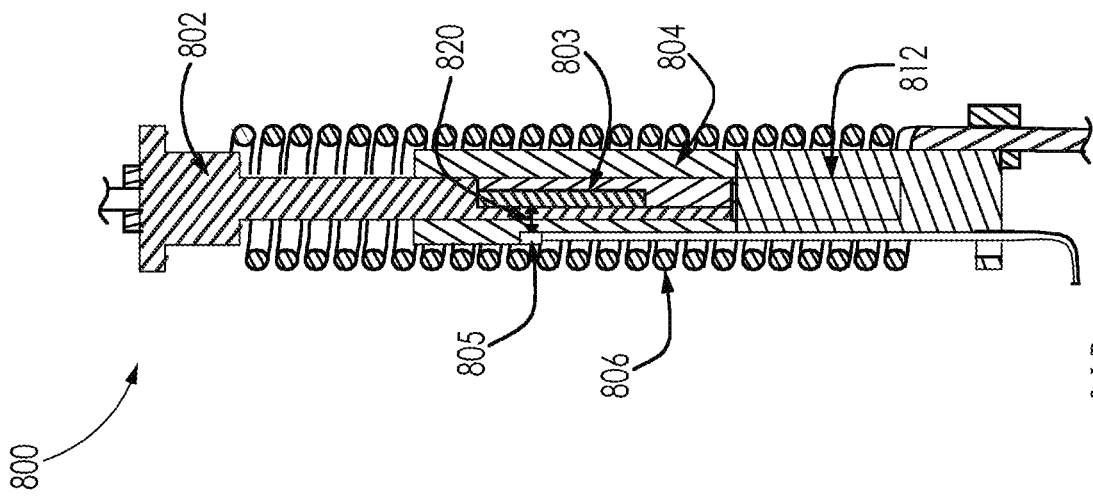
FIGS. 11A-11B are cross-sectional views of the sensor device of FIG. 8.
Figure 11A:
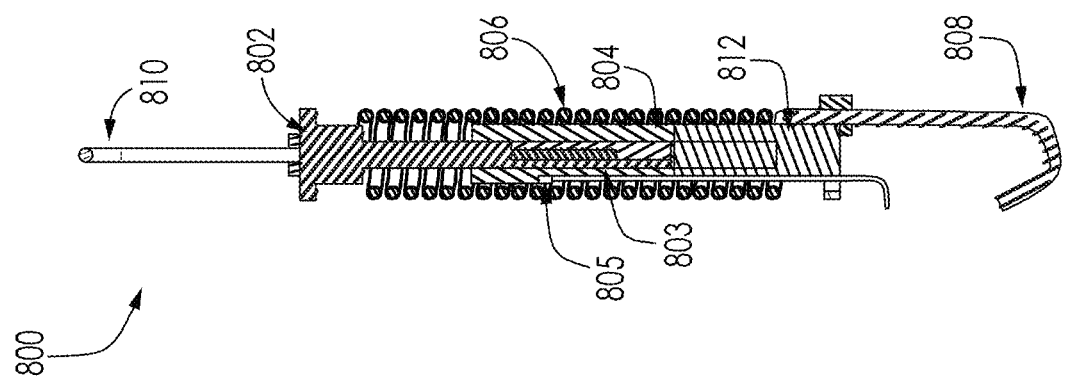

With reference to FIGS. 9 and 11A-11B, various advantageous of the sensor device 800 are illustrated. For example, the magnet 803 is positioned to the side of the magnetic sensor 805 such that the magnet 803 moves in a slide-by mode (e.g., translating) relative to the magnetic sensor 805 to maximize effective sensing range. Furthermore, the magnet 803 is positioned along the centerline of the spring 806 so as to minimize any magnetic effect of the material (e.g., steel) of the spring 806 on magnetic field. Still further, a cylindrical magnet 803 is used to address any rotational/assembly tolerance stack-up of the magnet mounting tube 802 and the sensor mounting tub 804/secondary sensor tube 812. In this way, a longer in length magnet 803 may be used to extend the effective sensing distance of the sensor device 800. As shown, the magnet mounting tube 802 and the sensor mounting tub 804/secondary sensor tube are fixed to two (2) locations outside of the working coils of the spring 806, which will move co-axially when spring 806 contracts/extends. Said differently, this configuration operates to prevent un-desired sensor-to-magnet tilting/rotation mounting/fixing as is present when these elements are attached in other locations (e.g. between adjacent coils of the spring 806).

Figure 12:
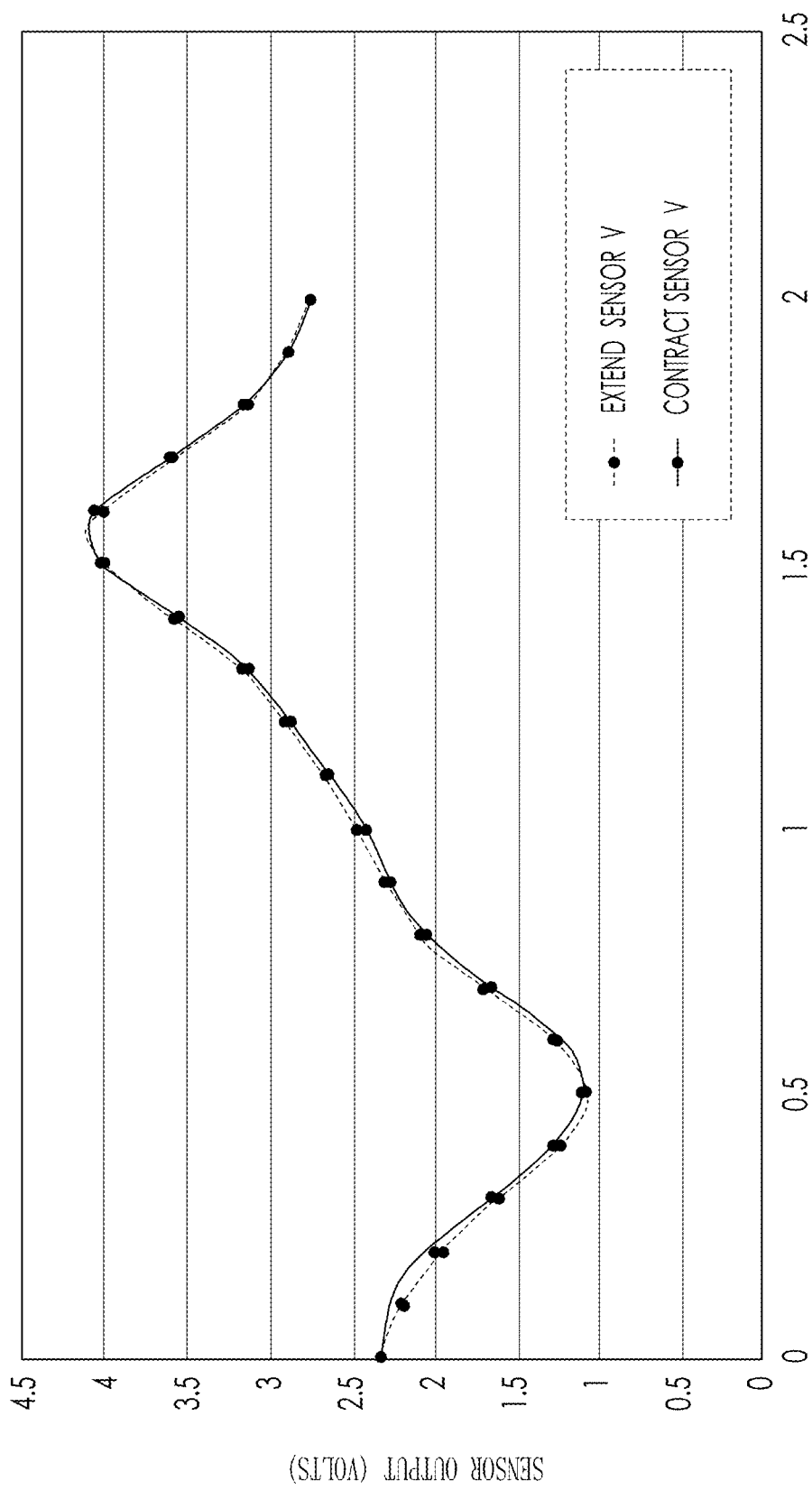
FIG. 12 is an example plot of spring expansion/contraction vs. sensor output voltage.

As illustrated, the magnetic sensor 805 may be positioned based on a sensing range requirement of the sensor device 800. However, the magnetic sensor 805 may be placed adjacent (to the side) of the magnet 803 and may be located in the middle portion of the magnet 803 as this location corresponds to the linear region. As noted above, the magnet 803 may be long and slender magnet (e.g., rectangular or circular cross section) to enable an increased active range with improved (e.g., fine) resolution. With reference to FIG. 12, a plot of spring expansion/contraction vs. output voltage is illustrated for the sensor device 800.

Method of Manufacture

Figure 7:
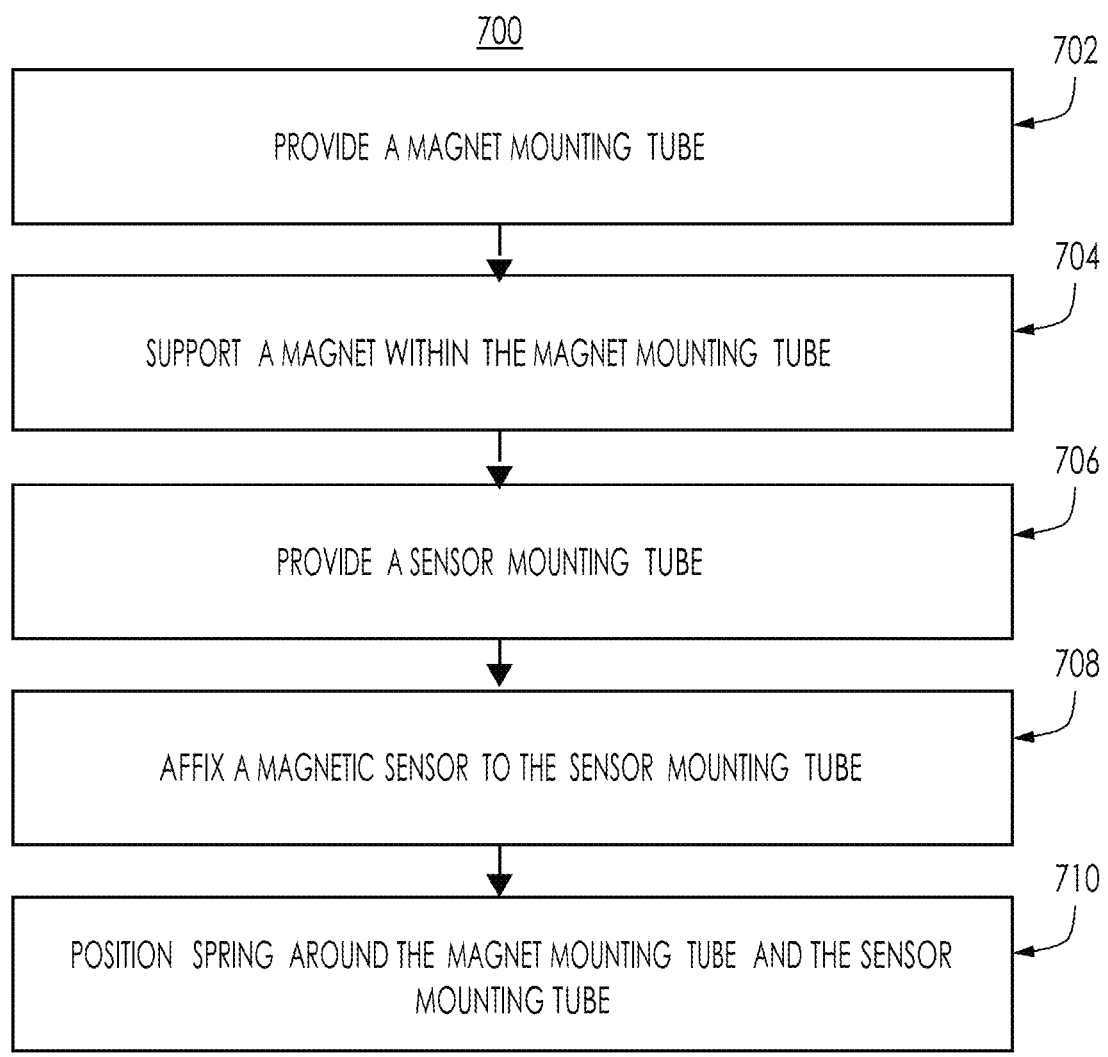
FIG. 7 is a method of manufacturing a sensor according to an example embodiment.

With reference to FIG. 7, an example method of manufacturing (e.g., method 700) a sensor device of the present application is illustrated. The method 700 may including providing a magnet mounting tube at operation 702 and may include supporting a magnet within the magnet mounting tube at operation 704. As described above, the magnet mounting tube may define a cylindrical housing (e.g., having a circular cross-section) that is configured to receive and support a magnet therein. The magnet may similarly be cylindrical in shape and may be formed of any suitable material (iron, cobalt, nickel, rare earth magnets, ceramic magnets, bonded magnets, or the like). While described herein with reference to a cylindrical magnet, the present disclosure contemplates that the magnet may also be formed as a rectangular prism.

With continued reference to FIG. 7, the method 700 may further include providing a sensor mounting tube at operation 706 and affixing a magnetic sensor to the sensor mounting tube at operation 708. The sensor mounting tube may be configured to receive at least a portion of the magnet mounting tube and supported magnet within the sensor mounting tube. In some embodiments, the sensor mounting tube may be cylindrical in shape and further define a hollow interior configured to receive a portion of the magnet mounting tube therein. In particular, the sensor mounting tube may be configured to receive the portion (e.g., an end) of the magnet mounting tube supporting the magnet such that the magnet extends at least partially into the sensor mounting tube. Furthermore, the engagement between the magnet mounting tube and the sensor mounting tube is such that the magnet mounting tube may translate relative the sensor mounting tube (e.g., may move within the sensor mounting tube).

The magnetic sensor may include a hall effect sensor, an anisotropic magneto-resistive (AMR) sensor, a giant magnetoresistance (GMR) sensor, a tunnel-magnetoresistance (TMR) sensor, or any similar sensor configured to identify a change in magnetic flux, a difference in magnetic field, a change (e.g., increase or decrease) of a magnitude of a magnetic field, or the like. In particular, movement of the magnet's position (e.g., and associated movement of the magnet mounting tube) within the sensor mounting tube may generate a change in magnetic flux that is identified via the differential voltage readings in the magnetic sensor. In order to prevent unintended contact between the magnetic sensor and the magnet, the magnet mounting tube and the sensor mounting tube may be dimensioned (e.g., sized and shaped) such that an air gap is defined between the magnet and the magnetic sensor. In some embodiments, the air gap may be five (5) millimeters.

The method 700 may further include positioning a spring around the magnet mounting tube and the sensor mounting tube at operation 710. The spring may be positioned around the magnet and the magnetic sensor such that the magnet is aligned with the direction of linear displacement of the spring (e.g., the cylindrical magnet is substantially aligned with the center of the coils of the spring). The spring may define a first end proximate the sensor mounting tube and a second end proximate the magnet mounting tube. Each of the first end and the second end may be formed or otherwise define engagement elements (e.g., hooks, clips, etc.) configured to secure each end of the spring when installed, for example, in an appliance.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A sensor device comprising:
 a magnet mounting tube;
 a magnet supported within the magnet mounting tube;
 a sensor mounting tube configured to receive at least a portion of the magnet mounting tube and supported magnet therein;
 a magnetic sensor affixed to the sensor mounting tube; and
 a spring positioned around the magnet mounting tube and the sensor mounting tube such that the magnet and the magnetic sensor are surrounded by the spring, wherein the spring defines a first end and a second end,
 wherein, in an instance in which a load is applied to either the first end or the second end, the magnet mounting tube is configured to translate relative the sensor mounting tube so as to induce a change in magnetic flux identified by the magnetic sensor indicative of a weight of the load.

2. The sensor device according to claim 1, wherein the magnet is cylindrical.

3. The sensor device according to claim 1, further comprising a sensor holder cap configured to secure the sensor mounting tube to the first end of the spring.

4. The sensor device according to claim 1, further comprising a magnet holder cap configured to secure the magnet mounting tube to the second end of the spring.

5. The sensor device according to claim 1, wherein the magnetic sensor comprises a hall effect sensor, an anisotropic magneto-resistive (AMR) sensor, a giant magnetoresistance (GMR) sensor, or a tunnel-magnetoresistance (TMR) sensor.

6. The sensor device according to claim 1, wherein the sensor mounting tube defines a hollow interior configured to receive the portion of the magnet mounting tube therein.

7. The sensor device according to claim 6, wherein the sensor mounting tube and the magnet mounting tube are positioned such that, in operation, an air gap is defined between the magnet and the magnetic sensor.

8. A sensing system comprising:
 a sensor device comprising:
  a magnet mounting tube;
  a magnet supported within the magnet mounting tube;
  a sensor mounting tube configured to receive at least a portion of the magnet mounting tube and supported magnet therein;
  a magnetic sensor affixed to the sensor mounting tube; and
  a spring positioned around the magnet mounting tube and the sensor mounting tube such that the magnet and the magnetic sensor are surrounded by the spring, wherein the spring defines a first end and a second end; and
 a controller communicably coupled to the magnetic sensor, wherein, in an instance in which a load is applied to either the first end or the second end:
  the magnet mounting tube is configured to translate relative the sensor mounting tube,
  the magnetic sensor is configured to identify a change in magnetic flux, and
  the controller is configured to determine a weight of the load based upon the change in magnetic flux.

9. The sensing system according to claim 8, wherein the magnet is cylindrical.

10. The sensing system according to claim 8, further comprising a sensor holder cap configured to secure the sensor mounting tube to the first end of the spring.

11. The sensing system according to claim 8, further comprising a magnet holder cap configured to secure the magnet mounting tube to the second end of the spring.

12. The sensing system according to claim 8, wherein the magnetic sensor comprises a hall effect sensor, an anisotropic magneto-resistive (AMR) sensor, a giant magnetoresistance (GMR) sensor, or a tunnel-magnetoresistance (TMR) sensor.

13. The sensing system according to claim 8, wherein the sensor mounting tube defines a hollow interior configured to receive the portion of the magnet mounting tube therein.

14. The sensing system according to claim 13, wherein the sensor mounting tube and the magnet mounting tube are positioned such that, in operation, an air gap is defined between the magnet and the magnetic sensor.

15. A method of manufacturing a sensor device, the method comprising:
 providing a magnet mounting tube;
 supporting a magnet within the magnet mounting tube;
 providing a sensor mounting tube configured to receive at least a portion of the magnet mounting tube and supported magnet therein;
 affixing a magnetic sensor to the sensor mounting tube; and
 positioning a spring around the magnet mounting tube and the sensor mounting tube such that the magnet and the magnetic sensor are surrounded by the spring, wherein the spring defines a first end and a second end,
 wherein, in an instance in which a load is applied to either the first end or the second end, the magnet mounting tube is configured to translate relative the sensor mounting tube so as to induce a change in magnetic flux identified by the magnetic sensor indicative of a weight of the load.

16. The method according to claim 15, wherein the magnet is cylindrical.

17. The method according to claim 15, further comprising securing the sensor mounting tube to the first end of the spring via a sensor holder cap.

18. The method according to claim 15, further comprising securing the magnet mounting tube to the second end of the spring via a magnet holder cap.

19. The method according to claim 15, wherein the sensor mounting tube defines a hollow interior configured to receive the portion of the magnet mounting tube therein.

20. The method according to claim 19, wherein the sensor mounting tube and the magnet mounting tube are positioned such that, in operation, an air gap is defined between the magnet and the magnetic sensor.

* * * * *